Oct. 6, 1970 H. E. MURPHY 3,532,892

CIRCUIT FOR DETERMINATION OF THE CENTROID OF AN ILLUMINATED AREA

Filed March 26, 1968

HOWARD E. MURPHY
INVENTOR.
BY Roger S. Borovoy
ATTORNEYS 3,532,892
CIRCUIT FOR DETERMINATION OF THE CENTROID OF AN ILLUMINATED AREA Howard E. Murphy, Redwood City, Calif., assignor to Fairchild Camera and Instrument Corporation, Syosset, New York, a corporation of Delaware
Filed Mar. 26, 1968, Ser. No. 716,223
Int. Cl. G01j *1/44, 1/20*
U.S. Cl. 250—203 8 Claims

ABSTRACT OF THE DISCLOSURE

A circuit for determining the centroid of an illuminated area utilizing a plurality of photosensitive detectors. The detectors are formed in a coplanar array with each detector sensing the illumination in a quadrant. The outputs of the detectors are compared to determine the displacement of the center or centroid of the illuminated area from a reference formed by the detector array. The comparison is accomplished without modulation of the illumination source.

BACKGROUND OF THE INVENTION

1. Field of the invention

The invention relates to the field of determining the centroid of an illuminated area using photosensitive electrical detectors. One of its principal applications is in the field of alignment such as mask alignment in semiconductor manufacturing.

2. Description of the prior art

In modern fabrication of numerous varieties of solid-state electronic devices utilizing photolithographic techniques, high-precision and high-resolution alignments are essential. Photolithographic processing steps typically involve the exposure of light-sensitive organic compounds (photoresists) through a photographic mask. Generally several masks are used at different steps in the fabrication of a solid-state device. It is essential that the masks be properly aligned relative to the original wafer and the patterns thereon in order that the successive operations are performed in proper relationship and registration. Similar problems arise in connection with the fabrication of production masks from master masks.

The general prior art (not relating to the mask alignment problem) has employed photosensitive detectors arranged to align a light source. These prior art systems have employed means to amplitude modulate or chop the radiation incident onto the detector. The AC signal created at the detector output could then be processed by an AC-coupled differential amplifier, thereby eliminating the problems and cost inherent in precision low-noise DC amplifiers. In the AC-type system, it was desirable that a reasonably high chopping rate be employed (e.g., 1–10 kHz.) in order to obtain an operating frequency high enough to enable design of low-noise amplifier and detector circuitry. This relatively high modulation frequency required the use of relatively expensive light sources and/or modulators. An additional difficulty frequently encountered when mechanical modulators, i.e., spinning wheels, were use was the spatial distribution of the phase of the modulation signal, which could give rise to a large signal at the position of best balance.

BRIEF SUMMARY OF THE INVENTION

The invented system comprises an array of photosensors where each sensor primarily senses the illumination in a selected region, an integrating circuit means for integrating the output of each sensor with respect to time and for providing an output signal representative thereof, comparator means coupled to the integrating circuit means for providing a pulse output signal having a characteristic related to a characteristic of said integrating circuit output signal, and pulse comparator means for providing an output signal representative of the difference in the characteristics of pulses from two different sensors, whereby said difference is a measure of the displacement of the centroid of the illuminated area from a reference determined by said sensors.

BRIEF DESCRIPTION OF THE DRAWINGS

FIG. 2 (a)–(h) illustrates the waveforms of signals processed in the system shown in FIG. 1.

DETAIL DESCRIPTION OF AN EMBODIMENT OF THE INVENTION

Figures 1, 2A, 2B, 2C, 2D, 2E, 2F, 2G, 2H, 3:
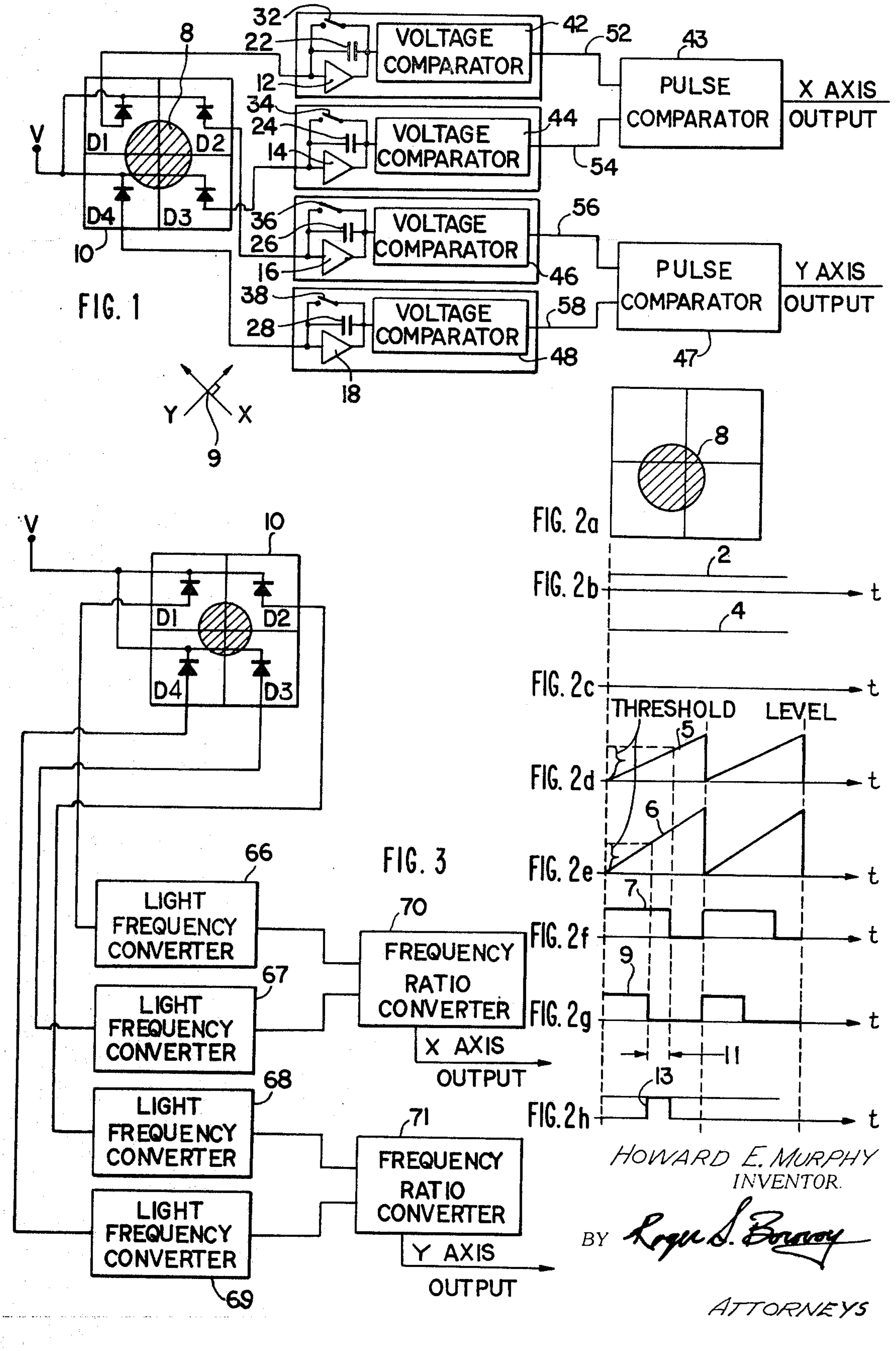
FIG. 1 is a block diagram of a circuit for determining the centroid of an illuminated area.
FIG. 3 is an alternate embodiment of the system shown in FIG. 1.

FIG. 1 illustrates one embodiment of the invention. The illuminated area 8 is shown with its centroid in the center of photosensing array 10. Array 10 comprises four solid-state photosensitive diodes each placed in one quadrant of coplanar array 10. Preferably the array 10 is fabricated by silicon planar technology with all of the devices on a single substrate and in close proximity to one another to obtain good thermal coupling and equal characteristics. The actual devices are referred to as diodes herein but may be transistors or other photosensing devices. The diodes $D_1$–$D_4$ are coupled through their cathodes to a common DC source. Each of the diodes produces a photocurrent representative of the illumination in its respective quadrant.

The current from each of the diodes $D_1$–$D_4$ is coupled to separate integrating circuits to form an integrating means. Each integrating circuit consists of a direct current amplifier 12, 14, 16 and 18 which has an integrating capacitor 22, 24, 26 and 28 coupled across its input and output terminals. There is a switching means 32, 34, 36 and 38 provided across each capacitor to allow the integrated voltage which appears across the capacitor to be periodically discharged and then charged. The switching means is illustrated as a mechanical switch but is preferably a reed switch or a solid-state switching device such as a bi-polar or uni-polar transistor including circuit means such as a clock to discharge simultaneously and periodically the voltages across capacitors 22, 24, 26 and 28.

The integrated voltage from each integrating circuit is coupled into voltage or amplitude comparator circuits 42, 44, 46 and 48. The voltage comparator circuit may consist of a Schmitt trigger with the integrated voltage applied to the control lead of the trigger. When the integrated voltage reaches a threshold control voltage, a discrete output voltage appears at the outputs 52, 54, 56 and 58 of the voltage comparator circuits. The threshold level of the comparators 42, 44, 46 and 48 are equal or approximately equal. This type of integrator-comparator circuit configuration has been shown to be one of the most accurate means of measuring photocurrent generated by solid-state photosensors, particularly planar silicon photodiodes. This circuit takes advantage of the high output impedance, low noise, and predictable temperature effects in silicon photodiodes. If the four diodes comprising the array are selected for matching of their dark, or reverse-leakage currents, then the effect of the exponential rise in dark current with temperature is the same for each quadrant and has negligible effect upon system operation.

The signals from the voltage comparators 42 and 44 are coupled to edge or pulse comparator 43 and the signals from voltage comparators 46 and 48 are coupled to edge or pulse comparator 47. Pulse comparator circuits 43 and 47 compare the period of the two input signals and produce an output voltage waveform representative of the difference of the periods, which will be shown to be representative of the difference between the detector photocurrents. Various embodiments for comparing the duration of the comparator output signals are known in the art. One example of a pulse comparator useful in a system employing a constant clock rate is to take the time average of signals 7 and 9 (FIG. 2) by a low-pass filter, use the averaged signals as inputs to a differential amplifier, and hence develop an analog error voltage with an amplitude representative of the position error and a polarity representative of the direction of the positional error. A second example of a pulse comparator more useful in a digital system is that of interconnecting logical "AND" and "INVERTER" circuits so as to form a first signal with a duration representative of the positional errora and second signal representative of the direction of the positional error. Other forms of pulse comparators are known, or can be conceived, to suit the applicational environment of the invention.

FIG. 2 illustrates the waveforms for the situation when the centroid or the uniformly illuminated circular area is in the negtaive Y direction, (FIG. 2*a*). (Directions X and Y have been indicated at 9). Waveforms 2 (FIG. 2*b*) and 4 (FIG. 2*c*) represent the current from the detectors D2 and D4 of FIG. 1. Since the illuminated area is greater in the quadrant containing D4 than the quadrant containing D2, the photocurrent through D4 is larger than that through D2. The output voltage signal of the integrating circuits 16, 26 and 18, 28 are shown by waveforms 5 (FIG. 2*d*) and 6 (FIG. 2*e*) respectively, assuming that their integration periods were started simultaneously by a system "clock" pulse. The integrating circuit integrates the input current with respect to time. Since input current 4 is larger than current 2, the slope of voltage waveform 6 is steeper than the slope of the voltage waveform 5. With the slope of signal 6 greater than the slope of signal 5, the threshold level of voltage comparator 48 is reached before the threshold of voltage comparator 46. The resultant signals from comparators 46 and 48 are shown by waveforms 7 (FIG. 2*f*) and 9 (FIG. 2*g*), respectively. The duration of signal 7 is longer than that of signal 9 since the threshold of comparator 48 was reached before the threshold of comparator 46. The difference in the period between signals 7 and 9 is shown at 11. The comparator 47 detects the difference in periods and converts the difference into a signal 13 having an amplitude related to the difference in durations and a polarity indicative of direction. This signal may be employed as an error signal for an automatic control mechanism or in connection with a go-no go mechanism or display or in connection with a digital display by including additional circuitry.

Periodically the integrated voltages are discharged simultaneously through the respective switching means. This causes the integrated voltage output of each integrating circuit to start again, resulting in a saw-tooth waveform of signals 5 and 6. The vertical broken lines of FIG. 2 indicate two such periods.

An alternative embodiment of the invention is shown in FIG. 3. In this embodiment, the output signals from the photo detectors are coupled into light-frequency converters 66–69. These converters change the direct-current output of the detector into an electrical signal having a frequency representative of the detector current. (One such converter circuit is described in U.S. Pat. 3,334,309, assigned to the same assignee as this invention.). The output of converters 66 and 67 are coupled into a frequency-ratio counter 70 and the outputs of converters 68 and 69 are coupled into frequency-ratio counter 71. The counters produce an output signal representative of the ratio of the frequencies of the input signals. Therefore, if the illuminated area is greater in one quadrant of two non-contiguous quadrants, the resultant frequency-ratio counter output signal will indicate the direction of the difference with signals similar to the outputs of means 43 and 47 of FIG. 1.

In connection with mask-alignment equipment, the array 10 of a plurality of photosensors form a reference or position mark on the apparatus (e.g., mask-alignment equipment) and the illuminated area may comprise an aperture in the mask with a light source behind it. When the aperture and array are aligned, a zero or null reading or signal will occur. Alignment by automatic servomechanism is feasible, since the centroid determining system can be immersed in a closed-loop, electromechanical system.

It is possible with both of the above described circuit embodiments to produce signals representative of the difference between the centroid of the illuminated area and the centroid of the detector array. These embodiments eliminate the requirement of a modulated illumination source used in the prior art and consequently an economical light source may be employed. It is relatively easy to adjust for slightly different photosensors or circuit sensitives in this invention. Since the systems employ a comparison technique, the effects of flicker and power line modulation of the light source are greatly reduced. The integrating embodiment further accentuates these advantages, and time-integration also reduces the effects of device and amplifier noise. The availability of a digital signal may also be advantageously employed in display and control systems.

Although this invention has been disclosed and illustrated with reference to particular applications, the principles involved are susceptible of numerous other applications which will be apparent to persons skilled in the art.

I claim:

1. A system for determining the centroid of an illuminated area comprising:
  - an array of photosensors, each photosensor producing a first signal proportional to the light incident on a region of said illuminated area;
  - a plurality of integrating means, each integrating means being connected to a corresponding one of said photosensors so as to integrate with respect to time said first signal from said corresponding photosensor;
  - a plurality of comparing means connected on a one-to-one basis to said plurality of integrating means, for providing a plurality of second signals, each second signal representing the amount of light incident on the photosensor connected to the corresponding integrating means; and
  - a multiplicity of comparator means, each comparator means being uniquely coupled to a given pair of said comparing means so as to provide an output signal proportional to the difference in light incident on two selected photosensors, said output signal providing a measure of the displacement of the centroid of the illuminated area from a reference determined by said array.

2. The system defined by claim 1 wherein each of said plurality of second signals is a pulse, each pulse having a duration related to the slope of the output signal from the corresponding integrating means.

3. The system defined in claim 2 wherein the output signal from each comparator means is representative of the difference between the durations of the pulses from the two comparing means connected to said comparator means.

4. The system defined in claim 3 wherein
  - at least two photosensors are employed in said array for determining a reference line;
  - said plurality of integrating means comprises at least two integrating circuits, each integrating circuit being coupled to a correspondng photosensor, each integrating circuit producing an intermediate signal having a slope that is proportional to the illumination impinging on the corresponding photosensor connected to said integrating circuit;

each of said comparing means comprises a voltage comparator that provides an output pulse when the intermediate signal from the corresponding integrating circuit exceeds a threshold level, the duration of said output pulse from said voltage comparator being inversely proportional to the slope of the intermediate signal from corresponding integrating circuit; and each of said comparator means is an edge comparator which senses the trailing edge of each of the output pulses from two selected voltage comparators coupled thereto to provide an output signal proportional to the relative time displacement of said trailing edges.

5. The system defined in claim 4 wherein each of said integrating circuits includes means coupled thereto for resetting the intermediate signal from said integrating circuit to a predetermined reference level periodically and simultaneously with the resetting of the intermediate signal from all the other integrating circuits to the same reference level.

6. The system defined in claim 5 wherein each of said comparing means comprises a Schmitt trigger circuit.

7. The system defined in claim 6 wherein said array comprises at least four solid-state photosensitive diodes each located in a different quadrant of an XY rectangular coordinate system and approximately equally spaced from said X and Y axes.

8. The system defined in claim 7 wherein each of said integrating means comprises a direct-current amplifier with a capacitor coupled across the input and output of said amplifier.

References Cited

UNITED STATES PATENTS

| | | | |
|---|---|---|---|
| 3,061,730 | 10/1962 | Jankowitz | 250—203 |
| 3,334,309 | 8/1967 | Murphy et al. | 250—208 X |
| 3,435,232 | 3/1969 | Sorensen | 250—203 |

JAMES W. LAWRENCE, Primary Examiner

E. R. LA ROCHE, Assistant Examiner

U.S. Cl. X.R.

250—208; 356—152, 172